United States Patent
Ramirez

(10) Patent No.: US 7,421,205 B2
(45) Date of Patent: Sep. 2, 2008

(54) INFRARED RECEIVER FOR RESIDENTIAL ELECTRICITY METER

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 462 days.

(21) Appl. No.: 10/891,932

(22) Filed: Jul. 15, 2004

(65) Prior Publication Data

US 2005/0055168 A1    Mar. 10, 2005

Related U.S. Application Data

(60) Provisional application No. 60/487,646, filed on Jul. 15, 2003.

(51) Int. Cl.
*H04B 10/04* (2006.01)
*H04B 10/24* (2006.01)

(52) U.S. Cl. ........................... 398/107; 398/202

(58) Field of Classification Search ......... 398/107–108, 398/202
See application file for complete search history.

(56) References Cited

U.S. PATENT DOCUMENTS

| 4,156,134 | A | | 5/1979 | Minner |
| 4,281,253 | A | * | 7/1981 | Culver ........................ 250/551 |
| 4,864,647 | A | * | 9/1989 | Harrington .................. 398/126 |
| 4,868,893 | A | * | 9/1989 | Hammond ................... 398/107 |
| 5,023,951 | A | | 6/1991 | Kahn |
| 5,166,819 | A | | 11/1992 | Eichel |
| 5,212,378 | A | | 5/1993 | Uda |
| 5,592,155 | A | | 1/1997 | Ehrenmann |
| 6,291,985 | B1 | * | 9/2001 | Bush ........................... 324/142 |
| 6,426,887 | B2 | | 7/2002 | Nagai et al. |

* cited by examiner

*Primary Examiner*—Leslie Pascal
(74) *Attorney, Agent, or Firm*—Maginot, Moore & Beck

(57) ABSTRACT

An electricity meter includes an input circuit operable to generate signals representative of a line voltage waveform and a line current waveform. A processing circuit is connected to the input circuit and is operable to generate energy consumption data based on the input signals. A communications circuit is also connected to the processing circuit. The communications circuit includes an optical receiver having a single photo-transistor, a single capacitor and two resistors. The photo-transistor is operable to act as a switching device that allows varying amounts of current to pass in association with received light pulses. This action allows light signals received by the photo-transistor to be converted into electrical signals. The electrical signals are passed across the first resistor. These electrical signals are differentiated by the capacitor and the second resistor to filter out low frequency signals created by ambient light.

15 Claims, 5 Drawing Sheets

INFRARED RECEIVER FOR RESIDENTIAL ELECTRICITY METER

CROSS-REFERENCE TO RELATED APPLICATIONS

This application claims the benefit of U.S. provisional patent application No. 60/487,646, filed Jul. 15, 2003.

BACKGROUND

Solid state electricity meters are widely used by electric companies to monitor the amount of electricity consumed by customers. When manufacturing utility meters, it is important to keep costs down while retaining full meter functionality. Lower costs allow the meter manufacturer to either increase profits per meter, or pass on the lower costs to its customers, thereby providing the meter manufacturer with a competitive advantage. To this end, even the slightest savings in meter manufacturing costs (e.g., pennies per meter) can be important, especially for meters sold on a large scale, such a residential electricity meters.

One area in which meter savings can be realized is in the bi-directional communications interface included on the meter. Modern solid state electricity meters include a receiver and a transmitter used for bi-directional communication between the meter and the electric company or meter manufacturer. Some modern high functionality meters include sophisticated transmitters and receivers for communicating in a wide variety of environmental conditions. However, most residential electricity meters only require basic receivers and transmitters, as communications required by residential electricity meters are typically limited to the controlled environments of the manufacturing floor and the meter shop of the electricity company. One example of a situation where communication activities are required for residential electricity meters is during calibration of the meter. Another example situation where communication activities are required for residential electricity meters is during meter set-up before the electric company installs the meter at the customer's residence. Because of the limited situations and environments in which residential electricity meters typically participate in information exchange, optical bi-directional communications interfaces are often preferred for use in residential electricity meters. Optical communications interfaces are preferred because they are cost effective while providing sufficient reliability and relative ease of use when compared to other communications interfaces that require physical connections.

In general terms, infrared bi-directional optical interfaces for electricity meters require a transmitter, a receiver, and supporting electronics to convert infrared light into appropriate electrical signals and vice-versa. Because the infrared transmitter is usually implemented employing only two discrete electronic components in the form of a light emitting diode and a current limiting resistor, opportunities for cost savings are limited. However, numerous circuits are used for infrared receivers in electricity meters. By implementing an optical receiver having relatively few electronic components, the meter manufacturer will achieve a cost savings that translates into a competitive advantage for the meter manufacturer.

Accordingly, it would be advantageous to provide a low cost receiver for a residential electricity meter that uses few electronic components.

SUMMARY

An electricity meter includes an input circuit operable to generate a first digital signal representative of a line voltage waveform and a second digital signal representative of a line current waveform. A processing circuit including a microprocessor is connected to the input circuit and is operable to generate energy consumption data based on the first digital signal and the second digital signal. A communications circuit is also connected to the processing circuit. The communications circuit includes an optical transmitter and an optical receiver.

The optical receiver includes a single photo-element in the form of a photo-transistor having a first lead, a second lead and a third lead. A voltage source is connected to the first lead of the photo-element. The optical receiver also includes a first resistor connected to the second lead of the photo-element and a single capacitor having one side connected to the second lead of the photo-element and an opposite side connected to a receiver output. In addition, the optical receiver includes a second resistor connected to the opposite side of the capacitor.

The photo-transistor is operable to act as a switching device that allows varying amounts of current to pass from the first lead to the second lead in association with pulses of light received by the third lead. This action allows light signals to be converted into electrical signals, passing the electrical signals across the first resistor. These electrical signals are differentiated by the capacitor and the second resistor to filter out low frequency signals created by ambient light.

DESCRIPTION

Figure 1:
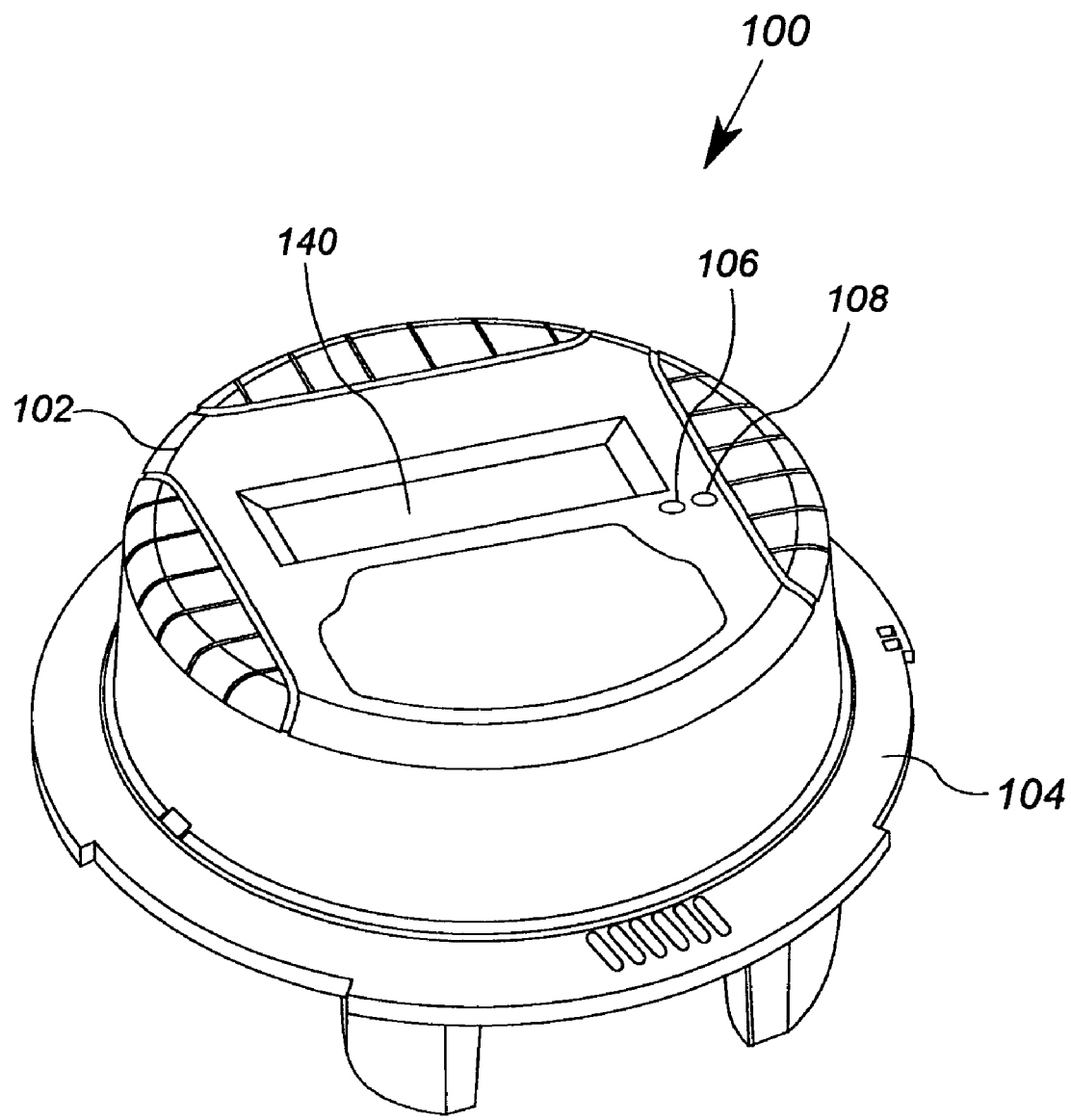
FIG. 1 shows a perspective view of an exemplary embodiment of a residential electricity meter having an infrared receiver.

As shown in FIG. 1, an exemplary residential electricity meter 100 is shown having an infrared receiver. The electricity meter 10 includes a housing 102 mounted on a baseplate 104. A transparent cover (not shown) may be provided that attaches to the baseplate 104 and covers the housing 102 to protect the housing from weather. A display 140 is visible from the exterior of the housing along with an LED 106. An optical opening 108 is provided on the housing for allowing optical signals to be transmitted through the housing.

Figure 2:
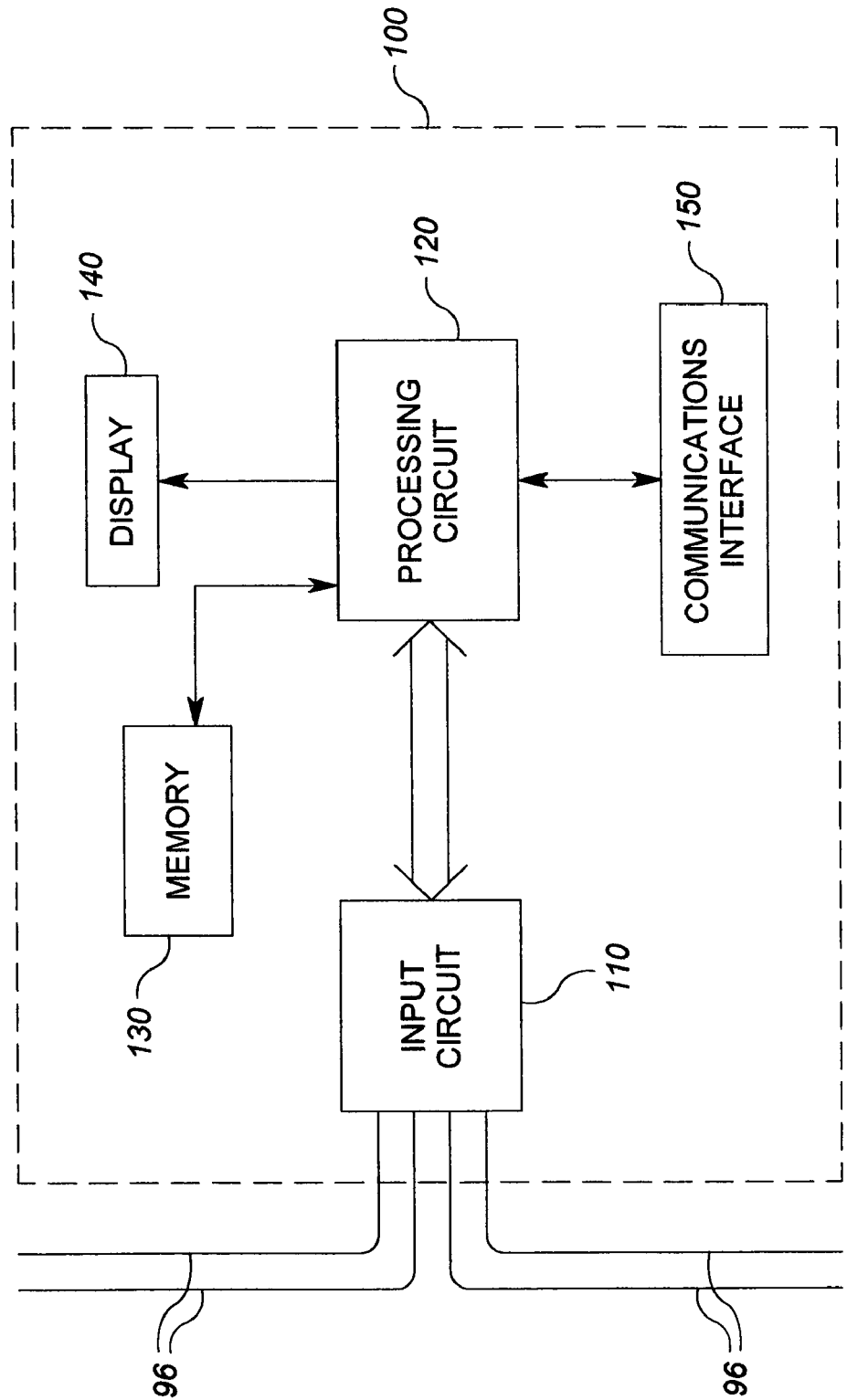
FIG. 2 shows a block diagram of an exemplary embodiment of a residential electricity meter having an infrared receiver.

FIG. 2 shows a block diagram of exemplary electronic components included in the interior of the residential electricity meter 100. The meter 100 is an apparatus for measuring energy consumption that includes an input circuit 110, a processing circuit 120, a memory 130, a display 140, and a communications interface 150.

In the embodiment described herein, the input circuit 110 is a circuit operable to generate a first digital signal representative of a line voltage waveform and a second digital signal representative of a line current waveform. To this end, the input circuit 110 may suitably comprise current and voltage sensors (not shown in FIG. 2) and one or more analog-to-digital converters (not shown in FIG. 2). Many circuits capable of generating digital voltage and circuit waveform signals are well known in the art. Suitable examples of input circuits having such capabilities are described in U.S. Pat. Nos. 6,374,188, 6,564,159, 6,121,158 and 5,933,004, all of which are incorporated herein by reference.

The processing circuit 120 is a device that employs one or more processing devices such as microprocessors, microcontrollers, digital signal processors, discrete digital circuits and/or combinations thereof. The processing circuit 120 is operable to generate energy consumption data based on the first digital signal and the second digital signal. For example, the processing circuit 120 may generate watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. Nos. 6,374,188, 6,564,159, 6,121,158 and 5,933,004. The processing circuit 120 is connected to the memory 130 and is operable to store data in the memory and/or retrieve data from the memory.

The meter display 140 may be a digital display such as a liquid crystal (LCD) display. However, it will be recognized that the display may take a number of different forms, including an analog display. Furthermore, in one embodiment, the display may be completely removed.

The communications interface 150 is a bi-directional communications interface that includes an optical transmitter and an optical receiver. Supporting electronics are included with the optical transmitter and optical receiver to convert light signals into appropriate electrical signals and vice-versa. The optical receiver includes a single photo-element that is exposed to the optical opening 108 in the meter housing 102. As explained in further detail below, light signals received by the lead are transformed into electrical signals for delivery to the processing circuit.

The meter 100 is connected to measure power flowing through power lines 96. The input circuit 110 generates a digital voltage signal, which preferably is a series of digital samples that represent a scaled version of the voltage waveform(s) on the one or more of the power lines 96. The input circuit 120 also generates a digital current signal, which preferably is a series of digital samples that represent a scaled version of the current waveform(s) on the one or more of the power lines 96.

The processing circuit 120 receives the digital voltage and current signals and generates energy consumption data, for example, data representative of kilowatt-hours or the like. The processing circuit 120 provides information representative of at least some of the energy consumption data to the display 140. Energy consumption data may also be provided to the memory 130. Communications interface 150 may be used to input and retrieve data from the meter.

Figure 3:
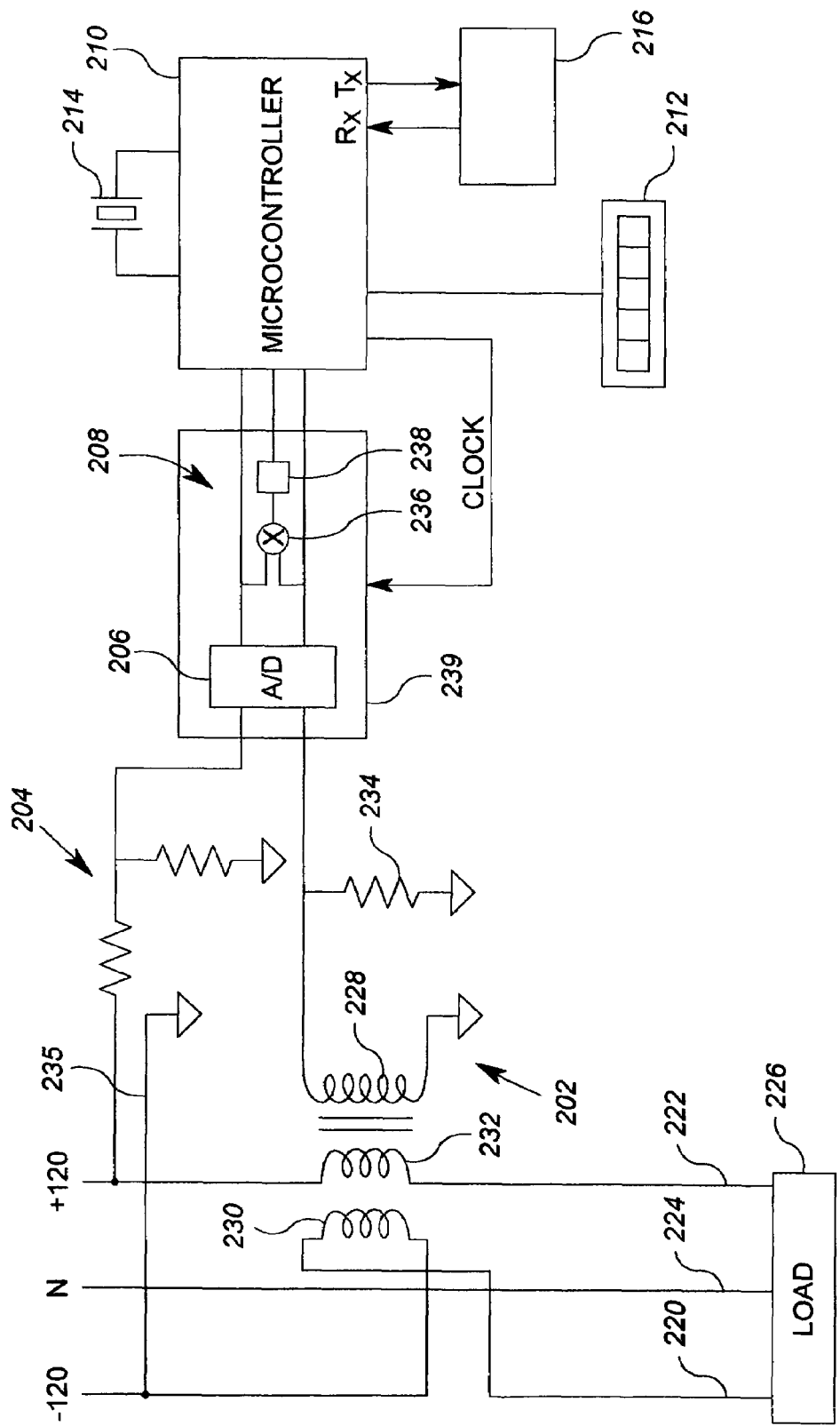
FIG. 3 shows a further detailed schematic block diagram of one example of a specific embodiment of the residential electricity meter of FIG. 2.

FIG. 3 shows in further detail an electricity meter 200 that represents a specific example of the meter 100 of FIG. 2. The electricity meter 200 is shown in context installed in a single phase power system common to residential electrical systems. The electrical system includes a −120 volt power line 220, a +120 volt power line 222, and a neutral line 224.

The electricity meter 200 includes an analog current input circuit 202, an analog voltage input circuit 204 and an analog-to-digital ("A/D") converter circuit 206. The electricity meter 200 further includes a processing circuit that includes a multiply-accumulator circuit 208 and a microcontroller 210. The electricity meter 200 also includes a display 212, an oscillator 214, and a communications circuit and interface 216. It is noted that the meter 200 may include additional elements as a matter of design choice. For example, the meter 200 may include an output circuit and/or additional communication circuits.

While the electricity meter 200 in FIG. 3 is configured to measure a residential single phase service connection as is known in the art, it is be appreciated that those of ordinary skill in the art may readily modify the arrangement of FIG. 3 to accommodate other known service connections including poly-phase service connections.

In the embodiment described herein, the power lines 220, 222 and a neutral line 224 are operably coupled to provide single-phase power to from a utility service provider, not shown, to a load 226. The analog current input circuit 202 and analog voltage input circuit 204 are coupled to the power lines 220 and 222.

The analog current input circuit 202 includes a current transformer ("CT") 228, first and second current coils 230 and 232, and a shunt 234. The first current coil 230 is coupled in the path of the power line 220 such that the power flowing through the first current coil 230 represents the current delivered to the load 226 through the power line 220. The second current coil 232 is similarly coupled in the path of the power line 222.

The CT 228 is in a current sensing relationship with each of the current coils 230 and 232. To this end, the CT 228 may suitably be a toroid having a circular core and a winding configured in a manner well known in the art. The current coils 230 and 232 are conductors that pass through the center opening of the toroid. Because of the relative winding ratio between the current coils 230 and 232 and the CT 228, the CT 228 generates a scaled down version of the current flowing on the power lines 220, 222. The CT 228 is further operably coupled to provide an analog current measurement signal based on this scaled down version of the power line current to the A/D converter circuit 206. To this end, the shunt 234 preferably comprises a resistor that is coupled across the CT 228 between the CT 228 and the A/D converter circuit 206.

The analog voltage measurement circuit 204 comprises a resistive voltage divider coupled between the power line 222 and the A/D converter circuit 206. A connection 235 from the power line 220 is used as to provide the "ground" reference for the voltage divider.

The A/D converter circuit 206 may suitably be one or more successive-approximation analog to digital converters or sigma-delta converters. The multiplier-accumulator circuit 208 may suitably be a digital signal processing device or the like that includes a multiplication function 236 and an accumulator 238. The A/D converter 206 and the multiplier-accumulator circuit 208 may be combined onto a single integrated circuit, referred to herein as a measurement IC 239.

The communications circuit and interface 216 includes an optical transmitter, an optical receiver and related circuitry to convert light signals into related electrical signals and vice-versa. As mentioned previously, the optical transmitter may take the form of an infrared LED and a single current limiting resistor.

Figure 4:
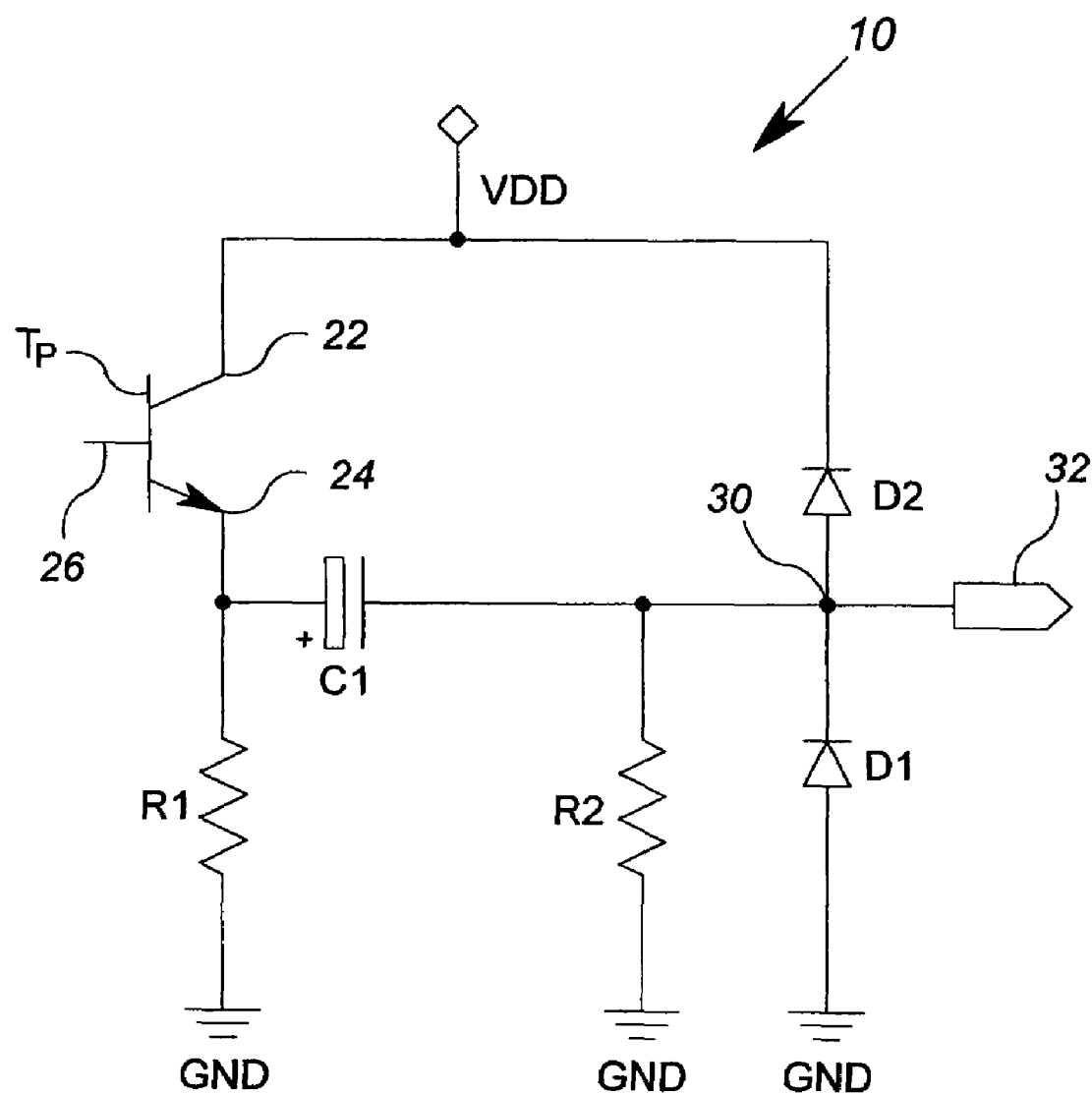
FIG. 4 shows a schematic of an infrared receiver for use in the residential electricity meter of FIG. 3.

As shown in FIG. 4, an infrared receiver 10 for residential electricity meters includes a single photo-element in the form of a photo-transistor Tp. The photo-transistor Tp is connected to a first resistor R1 and a high-pass filter formed by a single capacitor C1 and a second resistor R2. The phototransistor includes three leads, including a collector lead 22, an emitter lead 24 and a base lead 26. In one preferred embodiment, the photo-transistor Tp is a Vishay TMT1030 device, however, the photo-transistor may be any of a number of different commercially available photo-transistor devices, as will be recognized by one of skill in the art.

A voltage source, $V_{DD}$, is connected to the collector lead 22 of the photo-transistor Tp. The voltage source, $V_{DD}$, is typically the same voltage source provided for other electronic components in the residential electricity meter.

With continued reference to FIG. 4, the phototransistor Tp is designed to receive infrared light. Infrared light received by the phototransister Tp causes the phototransistor Tp to act as a switching device, allowing varying amounts of current to pass from the collector lead 22 to the emitter lead 24. The resistor R1 and the capacitor C1 are connected to the emitter lead 24 of the photo-transistor Tp. The resistor R1 leads to ground and provides 475 ohms of resistance. The capacitor leads to the output node 30 of the receiver 10. The capacitor C1 has a capacitance of 1 µF. The resistor R2 leads from the output node 30 to ground and provides 47.5 kilo-ohms of resistance. A connector 32 is provided at the output node 30 for connecting the receiver 10 to signal processing components in the meter.

In one preferred embodiment, a clamping circuit is provided in the form of two diodes D1 and D2 and is connected to the output node 30 of the receiver 10. Diode D1 leads from ground to the output node 30, while diode D2 leads from the output node 30 to the voltage source $V_{DD}$. FIG. 4 shows the clamping circuit provided on the receiver 10 side of the connector 32.

Figure 5:
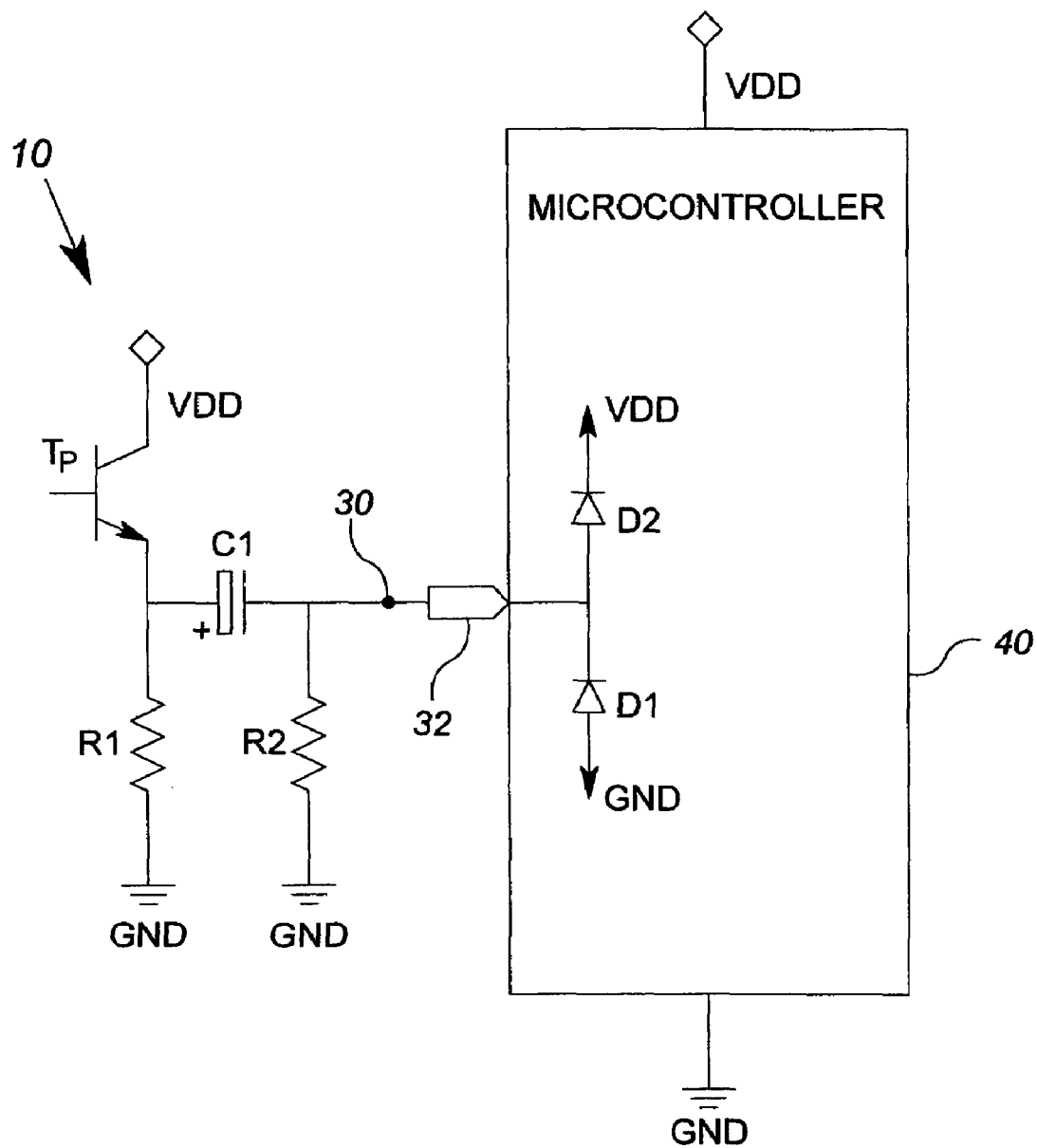
FIG. 5 shows the infrared receiver of FIG. 4 in association with the meter of FIG. 3.

As shown in FIG. 5, the voltage source is typically connected to a number of electronic components within the meter, including a microprocessor 40. The microprocessor 40 is operable to process electrical signals received from the receiver 10 and control meter operation based upon the signals received. The output signal from the receiver 10 is delivered to an interrupt driven I/O in the microprocessor. One pin of the microprocessor is dedicated to receipt of electrical signals from the receiver 10. The connector 32 is shown at this pin in FIG. 5 and provides the connection between the receiver 10 and the microprocessor 40. For example, with reference to FIG. 3, the connector 32 of FIG. 5 may connect to the microcontroller 210 of FIG. 3 at reference Rx. Various circuitry associated with the receiver may be included as part of the microcontroller. For example, as shown in FIG. 5, the clamping circuit comprising diodes D1 and D2 may be provided as internal components on an integrated circuit within the microcontroller 40. The microprocessor 40 also includes a connection to the voltage source $V_{DD}$ as well as a connection to ground.

In operation of the infrared receiver 10, a signal in the form of infrared light pulses is transmitted from a separate optical transmitter to the infrared receiver 10. These infrared light pulses are received at the portion of the photo-transistor Tp exposed to the optical opening 108 in the meter The phototransistor Tp acts as a switching device, as infrared light pulses received by phototransister of the receiver 10 allow related pulses of current to pass from the collector lead 22 to the emitter lead 24 of the phototransistor Tp. As current pulses from the emitter lead 24 of the phototransistor Tp, electrical signals are provided across the resistor R1. The high pass filter C1/R2 differentiates the signal detected across resistor R1 to remove its DC content, thereby filtering unwanted signals received by ambient light striking the phototransistor. The clamping diodes D1/D2 prevent the output signal from going above $V_{DD}$ or below ground.

Construction of an electricity meter having the above-described optical receiver begins with provision of a meter housing for retaining the optical receiver. As shown in FIG. 1, the meter housing includes an optical opening 108 designed and dimensioned to allow pulses of infrared light to be transmitted from the exterior of the housing to the interior of the housing. The receiver is typically assembled outside of the housing on a separate board and then positioned within the housing during manufacture of the meter. The receiver is positioned within the housing such that the a light receiving portion of the photo-transistor is arranged and disposed in the optical opening and optically exposed to the exterior of the electricity meter housing. This arrangement allows the phototransistor to receive pulses of infrared light from a transmitter positioned outside of the housing.

Accordingly, an infrared receiver for residential electricity meters is provided. Because relatively few electronic components are used to construct the receiver, it may be manufactured for a relatively low cost. In particular, the infrared receiver comprises only a single photo-element and a single capacitor. Despite relatively few components, the receiver is sufficiently reliable for typical communications required with residential electricity meters.

Although the above infrared receiver for residential electricity meters has been described with respect to certain preferred embodiments described herein, it is noted, however, that the embodiments described herein are merely exemplary, and that those of ordinary skill in the art may readily devise their own implementations that incorporate the principals of the present invention and fall within the spirit and scope thereof. For example, resistors and capacitors having different sizes and specifications than those described above could be implemented. Also, various types of photo-transistors could be used in the disclosed receiver. Furthermore, the output of the receiver may be routed to different electronic subsystems and components for processing the receiver output other than those disclosed herein. Furthermore, it is noted that alternative embodiments of the present invention may not include all of the features described herein yet still benefit from at least some of the advantages of the invention. Those of ordinary skill in the art may readily devise their own such implementations that incorporate one or more of the features of the present invention and fall within the spirit and scope thereof. It is further noted that the present invention is not limited to electrical utility meters, and thus, the present invention may readily be incorporated into other types of electronic utility meters, including gas meters, water meters, or other utility meters.

What is claimed is:

1. An apparatus for measuring energy consumption, comprising:
   an input circuit operable to generate a first digital signal representative of a line voltage waveform and a second digital signal representative of a line current waveform;
   a processing circuit operable to generate energy consumption data based on the first digital signal and the second digital signal;
   a communications circuit operable to convert optical signals into electrical signals, the communications circuit comprising
      a single photo-element including a first lead and a second lead,
      a first resistor connected to the second lead of the photo-element,
      a single capacitor having one side connected to the second lead of the photo-element and an opposite side connected to a receiver output, and
      a second resistor connected to the opposite side of the capacitor.

2. The apparatus of claim 1 wherein the communications circuit is further operable to convert electrical signals into optical signals.

3. The apparatus of claim 1 wherein the single photo-element comprises a photo-transistor including a third lead.

4. The apparatus of claim 1 wherein the photo-element is designed to receive pulses of infrared light.

5. An electricity meter comprising:
 a. an input circuit operable to generate a first digital signal representative of a line voltage waveform and a second digital signal representative of a line current waveform;
 b. a processing circuit connected to the input circuit, the processing circuit operable to generate energy consumption data based on the first digital signal and the second digital signal;
 c. an optical receiver connected to the processing circuit, the optical receiver comprising
  i. a single photo-element including a first lead and a second lead;
  ii. a voltage source connected to the first lead of the photo-element;
  iii. a first resistor connected to the second lead of the photo-element;
  iv. a single capacitor having one side connected to the second lead of the photo-element and an opposite side connected to a receiver output, the receiver output connected to a clamping circuit; and
  v. a second resistor connected to the opposite side of the capacitor.

6. The electricity meter of claim 5 wherein the single photo-element comprises a photo-transistor including a third lead.

7. The electricity meter of claim 5 wherein the meter is designed to receive pulses of infrared light.

8. The electricity meter of claim 5 wherein the receiver output is connected to a microprocessor in the processing circuit.

9. An electricity meter comprising:
 a. an electricity meter housing including an optical opening, the optical opening allowing light to pass from the exterior of the electricity meter housing to the interior of the electricity meter housing;
 b. an input circuit arranged within the electricity meter housing, the input circuit operable to generate a first digital signal representative of a line voltage waveform and a second digital signal representative of a line current waveform;
 c. a processing circuit arranged within the electricity meter housing and connected to the input circuit, the processing circuit operable to generate energy consumption data based on the first digital signal and the second digital signal;
 d. a voltage source arranged within the electricity meter housing; and
 e. an optical receiver positioned within the electricity meter housing, the optical receiver comprising
  i. a single photo-transistor comprising a first lead, a second lead and a third lead, the first lead connected to the voltage source and the second lead arranged in the optical opening;
  ii. a single capacitor having a first side and a second side, the first side of the capacitor connected to the second lead of the photo-transistor;
  iii. a first resistor connected to the second lead of the photo-transistor; and
  iv. a second resistor connected to the second side of the capacitor.

10. The electricity meter of claim 9 wherein the photo-transistor is operable to act as a switching device that allows varying amounts of current to pass from the first lead to the second lead in association with pulses of light received by the phototransistor, thereby causing electrical signals to pass across the first resistor.

11. The electricity meter of claim 10 wherein the capacitor and second resistor are operable to act as a high pass filter with respect to electrical signals passed across the first resistor.

12. A method of making an electricity meter comprising:
 a. providing an electricity meter housing;
 b. providing electrical components for installing an optical receiver in the electricity meter housing, the electrical components comprising a single photo-transistor, a single capacitor, a first resistor, and a second resistor, wherein the single photo-transistor comprises a first lead, a second lead and a third lead; and
 c. arranging the components in the electricity meter housing such that the photo-transistor is optically exposed to the exterior of the electricity meter housing, the first resistor is connected to the second lead of the photo-transistor, one side of the single capacitor is connected to the photo-transistor, and the opposite side of the single capacitor is connected to the second resistor, wherein the photo-transistor is operable to act as a switching device that allows varying amounts of current to pass from the first lead to the second lead in association with pulses of light received by the third lead, thereby causing electrical signals to pass across the first resistor, and the capacitor and second resistor are operable to act as a high pass filter with respect to electrical signals passed across the first resistor.

13. The method of claim 12 wherein the step of arranging the components in the electricity meter housing further comprises connecting the opposite side of the single capacitor is connected to a clamping circuit.

14. The apparatus of claim 1 wherein the opposite side of the single capacitor is connected to a clamping circuit.

15. The apparatus of claim 9 wherein the second resistor is further connected to a clamping circuit.

* * * * *